United States Patent [19]

Ohnaka et al.

[11] Patent Number: 5,029,175
[45] Date of Patent: Jul. 2, 1991

[54] SEMICONDUCTOR LASER

[75] Inventors: Kiyoshi Ohnaka, Moriguchi; Mototsugu Ogura, Takaichi, both of Japan

[73] Assignee: Matsushita Electric Industrial Co., Ltd., Osaka, Japan

[21] Appl. No.: 437,934

[22] Filed: Nov. 17, 1989

[30] Foreign Application Priority Data

Dec. 8, 1988 [JP] Japan .................................. 63-311114
Jun. 15, 1989 [JP] Japan .................................. 64-153369

[51] Int. Cl.⁵ ................................................ H01S 3/19
[52] U.S. Cl. ........................................ 372/46; 372/45; 357/17
[58] Field of Search ................. 372/45, 46, 43; 357/17

[56] References Cited

U.S. PATENT DOCUMENTS 4,602,371 7/1986 Kawano et al. ...................... 372/46
4,792,958 12/1988 Ohba et al. ............................ 372/45

FOREIGN PATENT DOCUMENTS 58-82589 5/1983 Japan ..................................... 372/46
61-176181 8/1986 Japan ..................................... 372/46
62-15876 1/1987 Japan ..................................... 372/46
62-200785 9/1987 Japan .

Primary Examiner—Georgia Epps
Attorney, Agent, or Firm—Wenderoth, Lind & Ponack

[57] ABSTRACT

In a semiconductor laser, an AlGaInP cladding layer of one conductive type, an active layer, and an AlGaInP cladding layer of other conductive type greater in thickness in stripes are formed on a GaAs substrate, and an insulating film, AlGaInP or amorphous layer smaller in refractive index than the AlGaInP cladding layer are formed at both sides of the stripes, wherein the light can be confined and guided also in the direction parallel to the active layer, and the light can be index-guided both in the direction parallel to the active layer and in the direction vertical thereto, so that a laser having an extremely smaller astigmatism may be presented. In addition, the current blocking layer disposed at the outer side of the insulating film, AlGaInP or amorphous layer is high in thermal conductivity, and the heat generated in the vicinity of the active layer may be efficiently released.

12 Claims, 13 Drawing Sheets

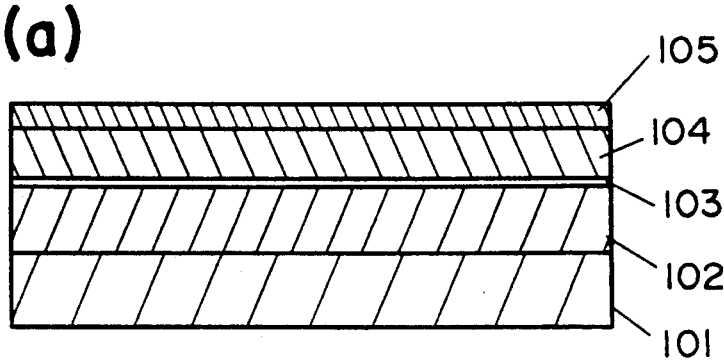
FIG. I(a)
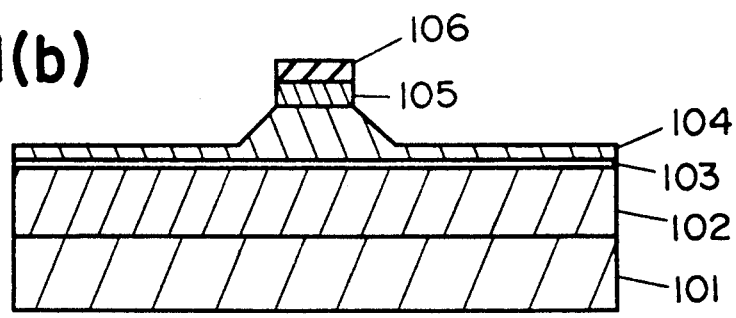
FIG. I(b)
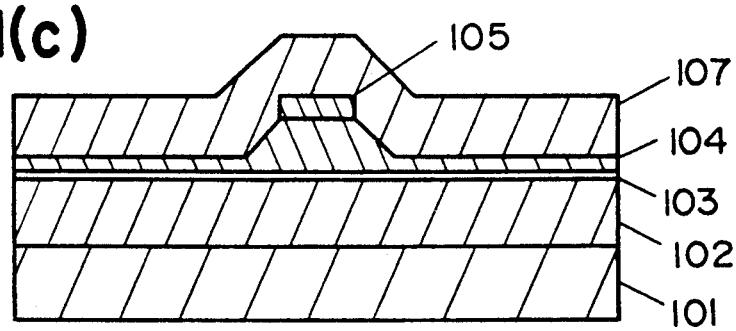
FIG. I(c)
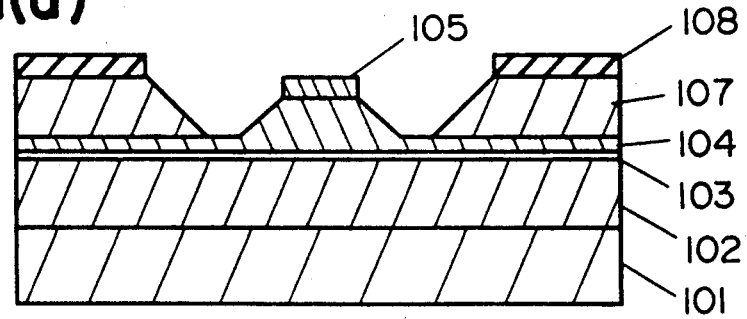
FIG. I(d)

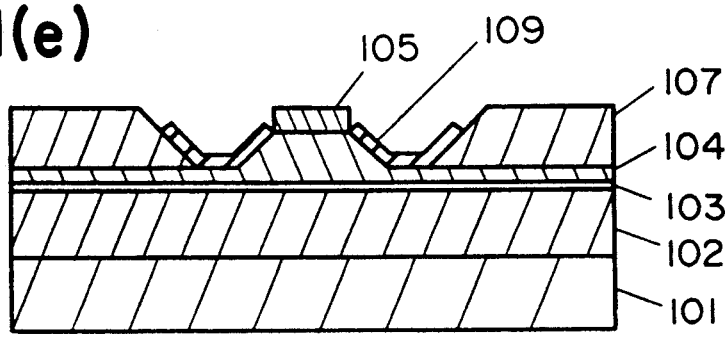
FIG. I(e)
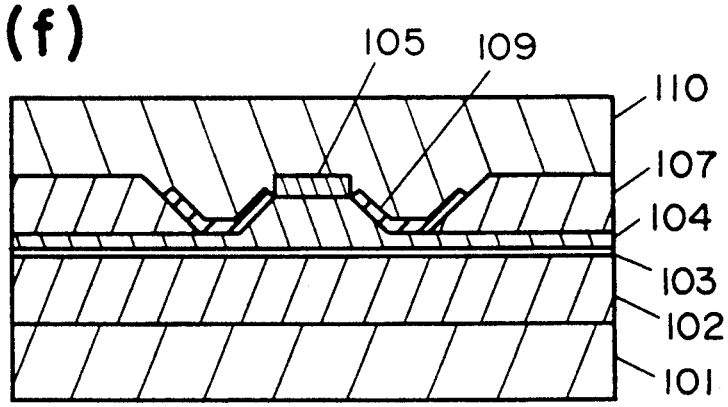
FIG. I(f)
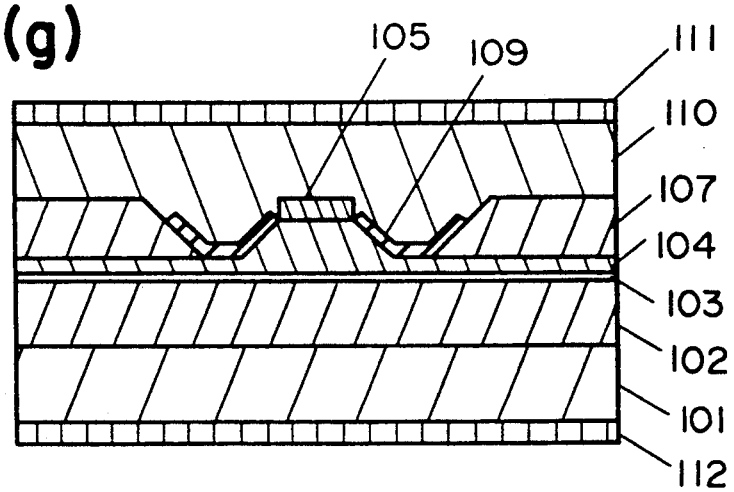
FIG. I(g)

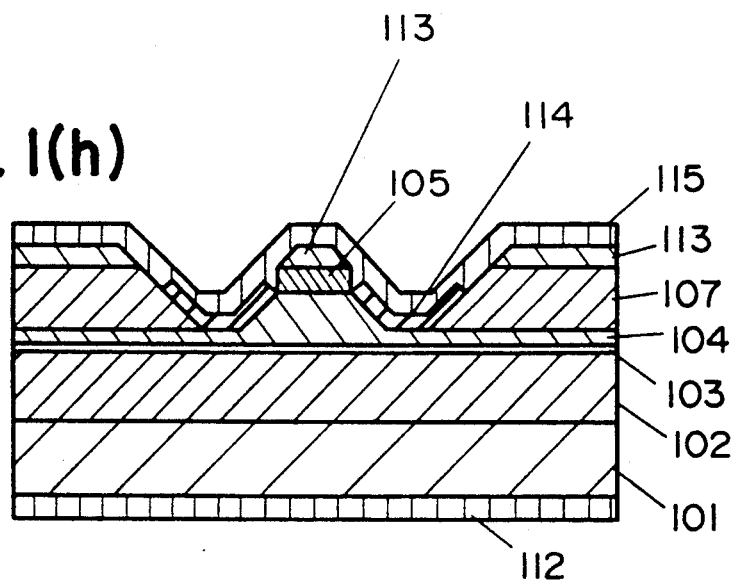

SEMICONDUCTOR LASER

BACKGROUND OF THE INVENTION

This invention relates to a semiconductor laser made of AlGaInP or similar material whose lateral mode is controlled.

A semiconductor laser emitting light at a wavelength of visible light of 700 nm or less is noticed as a light source for use in optical disk, laser beam printer, bar code reader and others. Above all, the double heterostructure semiconductor laser using GaAs as substrate, $Ga_{0.5}In_{0.5}P$ (hereinafter abbreviated GaInP) or $(Al_a\text{-}Ga_{1-x})_{0.5}In_{0.5}P$ (hereinafter abbreviated AlGaInP) for lattice matching therewith as active layer, and AlGaInP as cladding layer is prospective as the material for visible semiconductor laser because it can emit light of the shortest wavelength among the group III–V compound semiconductors having lattice matching with GaAs.

FIGS. 7(a)–7(c) show a sectional structure of manufacturing steps of a conventional lateral mode controlled AlGaInP semiconductor laser. First, as shown in FIG. 7(a), on the surface of an n-type GaAs substrate 701 having the (100) plane as the principal plane, n-type AlGaInP cladding layer 702, GaInP active layer 703, p-type AlGaInP cladding layer 704, and p type GaInP buffer layer 705 are sequentially formed by crystal growth by the MOVPE (metal organic vapor phase epitaxy) method. Next, using an $SiO_2$ film 706 formed in stripes in the <011> direction as the mask, a p-type GaInP buffer layer 705 is etched by reactive ion etching (RIE) using, for example, $CCl_4$ gas, and the p-type AlGaInP cladding layer 704 is etched in sulfuric acid at 40° C., for example, so that the result is as shown in FIG. 7(b). Furthermore, using the $SiO_2$ film 706 as the mask, an n-type GaAs current blocking layer 707 is selectively formed by crystal growth by the MOVPE method, and it becomes as shown in FIG. 7(c). After removing the $SiO_2$ film 706 used as the mask for selective growth, a p-type GaAs contact layer 708 is formed on the entire surface by crystal growth by the MOVPE method, and stripes are buried as shown in FIG. 7(d). Finally, on the surface, a p-type ohmic contact layer 709 made of Au/Zn/Au is formed, and the back surface is polished and etched to make the substrate thin, and an n-type ohmic contact layer 710 made of Au-Ge/Ni/Au is formed, and thereby a conventional lateral mode controlled AlGaInP semiconductor laser is completed as shown in FIG. 7(e).

In this conventional laser, the n-type GaAs current blocking layer 707 electrically serves the role of a current confinement layer, and optically plays the role of absorption type anti-guided layer because it has the refractive index larger than that of the p-type AlGaInP cladding layer 704 and absorbs the light emitted by the GaInP active layer 703. Accordingly, this conventional lateral mode controlled AlGaInP semiconductor laser oscillates at a lower threshold value.

In such conventional lateral mode controlled AlGaInP semiconductor laser, although the lateral mode is controlled, the light due to refractive index in the direction parallel to the active layer is not confined, and the gain guide remains strongly, and therefore the wave front of the guided wave in the direction parallel to the active layer is bent, which results in a large astigmatism. Therefore, when attempted to apply the conventional lateral mode controlled AlGaInP semiconductor laser in optical appliances, the scope of application is limited because it is impossible to spread the laser light into parallel light or focus into one spot by an ordinary convex lens alone.

Besides, since the n-type GaAs current blocking layer absorbs the light emitted in the active layer, it is a loss to the light for guiding the active layer, and it leads to the problem of increase of the oscillation threshold value for the portion of this loss.

SUMMARY OF THE INVENTION

This invention is intended to solve the above problems of the conventional lateral mode controlled AlGaInP semiconductor laser, and presents (1) a structure wherein an AlGaInP cladding layer of one conductive type, an active layer, and an AlGaInP cladding layer of other conductive type greater in thickness in stripes are formed on a GaAs substrate, an insulation layer lower in refractive index than the AlGaInP cladding layer of other conductive type is formed in a pair of stripes on the surface of the AlGaInP cladding layer of other conductive type at both sides of the stripes, and a current blocking layer of one conductive type is formed at the outer side thereof, (2) a structure wherein an AlGaInP cladding layer of one conductive type, an active layer, and an AlGaInP cladding layer of other conductive type with a dovetail-shaped mesa section greater in thickness in stripes formed in the $<01\bar{1}>$ direction are formed on a GaAs substrate having (100) as the principal plane, an insulation layer lower in refractive index than the AlGaInP cladding layer of other conductive type is formed on the dovetail-shaped mesa surface of the AlGaInP cladding layer of other conductive type, and a current blocking layer of one conductive type is formed at the outer side thereof, (3) a structure wherein an AlGaInP cladding layer of one conductive type, an active layer, and an AlGaInP cladding layer of other conductive type greater in thickness in stripes are formed on a GaAs substrate, an insulation layer lower in refractive index than the AlGaInP cladding layer of other conductive type is formed in a pair of stripes on the surface at both sides of the stripes of the AlGaInP cladding layer of other conductive type in a region in the vicinity of the output facet of laser light, and a current blocking layer of one conductive type is formed on the outer side thereof and on the surface of both sides of the stripes of the AlGaInP cladding layer of other conductive type in the region free from the insulation layer, (4) a structure wherein an AlGaInP cladding layer of one conductive type, an active layer, and an AlGaInP cladding layer of other conductive type greater in thickness in stripes are formed on a GaAs substrate, an AlGaInP or AlInP layer lower in refractive index than the AlGaInP cladding layer of other conductive type is formed in a pair of stripes on the surface of the AlGaInP cladding layer of other conductive type on both sides of the stripes, and a current blocking layer of one conductive type is formed on the outer side thereof, (5) a structure wherein an AlGaInP cladding layer of one conductive type, an active layer, and an AlGaInP cladding layer of other conductive layer with a dovetail-shaped mesa section greater in thickness in stripes formed in the $<01\bar{1}>$ direction are formed on a GaAs substrate having (100) as the principal plane, an AlGaInP or AlInP layer lower in refractive index than the AlGaInP cladding layer of other conductive type is formed on the dovetail-shaped mesa surface of the AlGaInP cladding layer of other conductive layer, and a current blocking layer of one conductive type is formed on the outer side thereof, (6) a structure wherein an AlGaInP cladding layer of one conductive type, an active layer, and an AlGaInP cladding layer of other conductive type greater in thickness in stripes are formed on a GaAs substrate, an AlGaInP or AlInP layer lower in refractive index than the AlGaInP cladding layer of other conductive type is formed in a pair of stripes on the surface at both sides of the stripes of the AlGaInP cladding layer of other conductive type in the region in the vicinity of the output facet of laser light, and a current blocking layer of one conductive type is formed on the outer side thereof and on the surface at both sides of the stripes of the AlGaInP cladding layer of other conductive type in the region free from the AlGaInP or AlInP layer lower in refractive index, and (7) a structure wherein an AlGaInP cladding layer of one conductive type, an active layer, an AlGaInP cladding layer of other conductive type, and a contact layer of other contact layer are formed in stripes on a GaAs substrate, and an AlGaInP cladding layer of other conductive type and an amorphous layer lower in refractive index than the AlGaInP cladding layer of one conductive type and the AlGaInP cladding layer of other conductive type are formed at both sides of the stripes, and furthermore the above structures are realized by (8) a manufacturing method comprising a step of forming an AlGaInP cladding layer of one conductive layer, an active layer, and an AlGaInP cladding layer of other condcutive type on a GaAs substrate having (100) as the principal plane, a step of etching the AlGaInP cladding layer of other conductive type in stripes in the $<01\bar{1}>$ direction and so as to be greater in thickness in the stripes, a step of forming a current blocking layer of one conductive type on the surface of the AlGaInP cladding layer of other conductive type, a step of forming a pair of grooves by etching the current blocking layer of one conductive type on the stripes of the AlGaInP cladding layer of other conductive type and on both sides of the stripes, a step of forming an insulation layer lower in refractive index than the AlGaInP cladding layer of other conductive type in a pair of stripes on the surface of said one pair of grooves, and a step of forming a contact layer of other conductive type at least on the stripes of the AlGaInP cladding layer of other conductive type and the surface of current blocking layer of one conductive type, (9) a manufacturing method comprising a step of forming an AlGaInP cladding layer of one conductive type, an active layer, and an AlGaInP cladding layer of other conductive type on a GaAs substrate having (100) as the principal plane, a step of etching the AlGaInP cladding layer of other conductive type in the dovetail-shaped mesa shape in steps in the $<01\bar{1}>$ direction and so as to be greater in thickness in the stripes, a step of forming an insulation layer lower in refractive index than the AlGaInP cladding layer of other conductive layer on the dovetail-shaped mesa surface of the AlGaInP layer of other conductive type in the dovetail-shaped mesa shape, a step of selectively forming a current blocking layer of one conductive type on the surface of the AlGaInP cladding layer exposed on the surface, and a step of forming a contact layer of other conductive type at least on the stripes of the AlGaInP cladding layer of other conductive type and on the surface of the current blocking layer of one conductive type, (10) a manufacturing method comprising a step of forming an AlGaInP cladding layer of one conductive type, an active layer, and an AlGaInP cladding layer of other conductive type on a GaAs substrate having (100) as the principal plane, a step of etching the AlGaInP cladding layer of other conductive type in a dovetail-shaped mesa shape in stripes in the $<01\bar{1}>$ direction and so as to be greater in thickness in the stripes, a step of selectively forming an AlGaInP or AlInP layer of other conductive type lower in refractive index than the AlGaInP cladding layer on the dovetail-shaped mesa side face of the AlGaInP cladding layer of other conductive type with dovetail-shaped mesa shape, a step of selectively forming a current blocking layer of one conductive type on the surface of the AlGaInP cladding layer of other conductive type exposed on the surface, and a step of forming a contact layer of other conductive type on the stripes of the AlGaInP cladding layer of other conductive type, on the surface of the AlGaInP or AlInP layer of other conductive type lower in refractive index, and on the surface of the current blocking layer of one conductive type, and (11) a manufacturing method comprising a step of forming an AlGaInP cladding layer of one conductive type, an active layer, an AlGaInP cladding layer of other conductive layer and a contact layer of other conductive layer on a GaAs substrate, a step of etching in stripes the AlGaInP cladding layer of one conductive type, the active layer, the AlGaInP cladding layer of other conductive type and the contact layer of other conductive type, a step of forming an amorphous layer lower in refractive index than the AlGaInP cladding layer of other conductive type and AlGaInP cladding layer of one conductive type on the entire surface, a step of coating the surface with a film same in etching rate as the amorphous layer, and a step of exposing the surface of the contact layer of other conductive type by etching the stripe-shaped amorphous film together with the coating film.

Having the structures as mentioned herein, this invention possesses the following actions and effects.

In structures (1), (2) and (4), since the insulating film smaller in refractive index than the AlGaInP cladding layer is formed at both sides of the stripes, the light can be confined and guided also in the direction parallel to the active layer, and therefore the light is guided with refractive index not only in the direction parallel to the active layer but also in the direction vertical thereto, so that the astigmatism is much smaller than the layer in the prior art. Still more, the current blocking layer outside of the insulating film is high in thermal conductivity, and the heat generated in the vicinity of the active layer may be efficiently dispersed.

In structure (5), since the AlGaInP or AlInP layer smaller in refractive index than the AlGaInP cladding layer is formed at both sides of the stripes, the light can be confined and guided also in the direction parallel to the active layer, and furthermore when the conductive type of AlGaInP or AlInP layer smaller in refractive index is other conductive type, the current injection is effected also from the AlGaInP or AlInP layer of other conductive type smaller in refractive index into the active layer, if the refractive index of the active layer should be lowered by current injection, effects on the guided mode are small. Therefore, in both direction parallel to the active layer and direction vertical thereto, the light is guided with refractive index, and the astigmatism is much smaller than in the conventional laser. Moreover, since the current blocking layer outside of the AlGaInP or AlInP layer smaller in refractive index is high in thermal conductivity, the heat generated in the vicinity of the active layer may be efficiently dispersed.

In structure (3) or (6), in the vicinity of the output facet of the laser, since the insulating film and AlGaInP or AlInP layer smaller in refractive index than the cladding layer are disposed at both sides of the stripes, the guided light is completely confined in the stripes, and the output light is small in astigmatism, and furthermore in the region other than the region where the insulating film is buried, since the same gain guided component as in the prior art is left over, the vertical mode of the laser oscillation becomes a multimode. As a result, the semiconductor laser is not affected so much by the disturbance such as feedback light and can operate stably.

In structure (7), since the amorphous film smaller in refractive index than the AlGaInP cladding layer is formed at both sides of stripes, the light can be confined and guided also in the direction parallel to the active layer, and therefore the light is guided with refractive index in the direction parallel to the active layer and in the direction vertical thereto, so that the astigmatism is much smaller than in the laser shown in the prior art. Moreover, since the thermal conductivity of the amorphous film such as amorphous Si is high, the release of the heat generated in the vicinity of the active layer is smooth. Still more, the amorphous film is highly resistive, and electrically acts as a current blocking layer.

According to the manufacturing method of (8), after crystal growth of n-type GaAs current blocking layer, the p-type GaInP buffer layer and p-type AlGaInP cladding layer in stripes can be formed by selective etching, and it is not necessary to grow crystals selectively.

In manufacturing method (9), since the insulating film can be left over selectively by anisotropy of etching without requiring the step of mask matching with the side face and dovetail-shaped mesa surface of stripes, the process is simple, and the width can be narrowed. Furthermore, since the width of the insulating film formed on the side face and dovetail-shaped mesa surface of the stripes is nearly same as the film thickness, the p-type GaAs contact layer is easily connected on the insulating film when forming the p-type GaAs contact layer by crystal growth, and therefore the contact area between the p-type GaAs contact layer and the p-side ohmic contact electrode can be widened, so that the contact resistance can be reduced.

In manufacturing method (10), the side surface of the AlGaInP or AlInP layer of other conductive type smaller in refractive index than the cladding layer formed on the dovetail-shaped mesa side surface is also in dovetail-shaped mesa shape, so that the width can be narrowed. Therefore, by narrowing the stripe width of refractive index guide, the stripe width of the current injection can be also narrowed at the same time, so that the low threshold current single lateral mode oscillation can be obtained.

In manufacturing method (11), crystal growth is required only once, and the element fabrication is simplified.

BRIEF DESCRIPTION OF THE DRAWINGS

FIGS. 1(a)–1(l), 2(a)–2(l), 3(a)–3(g), and 6(a)–6(g) respectively show schematic sectional structural drawings in manufacturing steps of semiconductor laser in accordance with the first, second, third and sixth embodiments of the present invention.

DETAILED DESCRIPTION OF THE INVENTION

Figure 2A:
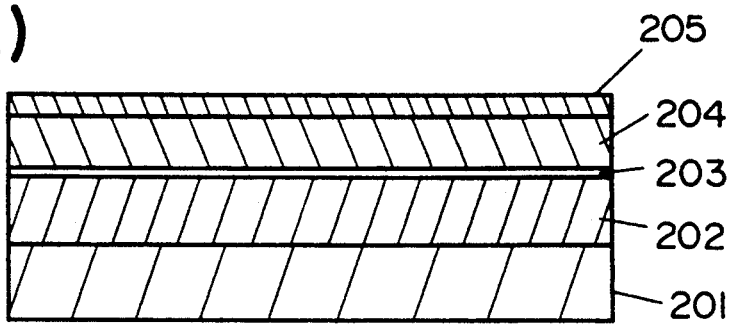

Referring now to the drawings, some of the embodiments of the invention are described in detail below. FIGS. 1(a)–1(h) show schematic sectional structural drawings in the manufacturing steps of an AlGaInP semiconductor layer in accordance with a first embodiment of the present invention. First, as shown in FIG. 1(a), for example, on the surface of an n-type GaAs substrate 101 having (100) plane as the principal plane, an n-type AlGaInP cladding layer 102 (for example, $x=0.6$, carrier density $5\times 10^{17}$ cm$^{-3}$, thickness 1 $\mu$m), a GaInP active layer 103 (for example, thickness 0.2 $\mu$m), a p-type AlGaInP cladding layer 104 (for example, $x=0.6$, carrier density $1\times 10^{18}$ cm$^{-3}$, thickness 0.7 $\mu$m), and a p-type GaInP buffer layer 105 (for example, carrier density $3\times 10^{18}$ cm$^{-3}$, thickness 0.3 $\mu$m) are sequentially formed by crystal growth by lattice matching with the n-type GaAs substrate 101 by the MOVPE method. Next, for example, in the <011> direction, using an SiO$_2$ film 106 in stripes of, for example, 4 $\mu$m in width as the mask, the p-type GaInP buffer layer 105 is etched by RIE using, for example, CCl$_4$ gas, and also the p-type AlGaInP cladding layer 104 is etched for, say, 4 minutes in sulfuric acid at, say, 40° C. so as to leave the p-type AlGaInP cladding layer 104 in a thickness of 0.3 $\mu$m at the outer side of the stripes, so that the composition as shown in FIG. 1(b) is obtained. In this embodiment, since the stripes are formed in the <011> direction, the p-type AlGaInP cladding layer 104 at both sides of the stripes is etched in a forward taper shape. Next, removing the SiO$_2$ film 106, when the n-type GaAs current blocking layer 107 is entirely formed by crystal growth, the result is as shown in FIG. 1(c). Next, using an Si$_3$N$_4$ film 108 as etching mask, when an n-type GaAs current blocking layer 107 is selectively etched in a mixed solution of, for example, H$_2$SO$_4$:H$_2$O$_2$:H$_2$O = 1:1:10, the n-type GaAs current blocking layer 107 at both sides of the stripes is etched as shown in FIG. 1(d), and a pair of grooves are formed at both sides of the stripes. In succession, as shown in FIG. 1(e), after removing the Si$_3$N$_4$ film 108 used as the mask, an insulating film lower in refractive index than the newly deposited p-type AlGaInP cladding layer 104, for instance, Si$_3$N$_4$ film 109 of 0.1 $\mu$m in thickness is selectively formed in the pair of grooves at both sides of the stripes. Furthermore, on the entire surface, a p-type GaAs contact layer 110 (for example, carrier density $5\times 10^{18}$ cm$^{-3}$, thickness 3 $\mu$m) is formed by crystal growth by the MOVPE method, and the stripes are buried as shown in FIG. 1(f). Depending on the condition of crystal growth, the p-type GaAs contact layer 110 may not be formed by crystal growth on the surface of the Si$_3$N$_4$ film 109, but even in such a case, there is substantially no relation with the operation of the AlGaInP semiconductor laser of the first embodiment of the invention. Finally, a p-type ohmic contact electrode 111 made of Au/Zn/Au is formed on the surface, and the back surface is polished and etched to make the substrate thin, and an n-type ohmic contact electrode 112 made of Au-Ge/Ni/Au is formed, and hence the AlGaInP semiconductor laser of the first embodiment of the invention is completed as shown in FIG. 1(g).

Meanwhile, in the first embodiment of the present invention described herein, at the step of crystal growth in FIG. 1(f), if the p-type GaAs contact layer 110 is not formed on the surface of the Si$_3$N$_4$ film 109, or if the Si$_3$N$_4$ film 114 is formed in a pair of grooves formed by etching the p-type GaAs contact layer 113 and n-type GaAs current blocking layer 107 at both sides of the stripes after burning the p-type GaAs contact layer 113 (for example, carrier density $5\times10^{18}$ cm$^{-3}$, thickness 1 μm) in the entire surface without forming the Si$_3$N$_4$ film 109 in the step shown in FIG. 1(e), the shape becomes as shown in FIG. 1(h). In FIG. 1(h), a Cr/Au/Pt/Au 115 is used as the p-side contact electrode. The Cr/Au/Pt/Au electrode is a non-alloy electrode, and is excellent in adhesion with insulating film, and therefore it is effective when the insulating film is exposed on the surface as in FIG. 1(h) or when the p-type GaAs contact layer is thin.

What is characteristic of the first embodiment of the present invention described herein is, structurally, that the light can be confined and guided also in a direction parallel to the active layer because the insulating film smaller in refractive index than the AlGaInP cladding layer is formed at both sides of the stripes, and hence guiding with refractive index is effective both in the direction parallel to the active layer and in the direction vertical thereto, so that the astigmatism is far smaller than in the conventional laser. Still more, the thermal conductivity of the Si$_3$N$_4$ film buried at both sides of the stripes is 0.12 W/cm.deg., which is lower than 0.54 W/cm.deg. of GaAs, but in the first embodiment of the invention, since the film thickness of the Si$_3$N$_4$ film may be made as thin as 0.1 μm and the Si$_3$N$_4$ film is buried only in the portion of the grooves at both sides of the stripes and the n-type GaAs current blocking layer is formed at the outer side thereof, and therefore release of heat generated in the vicinity of the active layer will not be impaired by the Si$_3$N$_4$ film. Furthermore, in the first embodiment of the invention, when the p-type GaAs contact layer 110 is also formed by crystal growth on the surface of the Si$_3$N$_4$ film 109, the surface becomes flat, and the contact area with the p-type ohmic contact electrode 111 is wider as compared with the structure shown in FIG. 1(h), so that the contact resistance may be easily lowered.

On the other hand, the features in the manufacturing steps of the first embodiment of the invention are as follows: after crystal growth of the n-type GaAs current blocking layer 107, the p-type GaInP buffer layer 105 and p-type AlGaInP cladding layer 104 may be formed in stripes by selective etching, and selective growth of crystals is not needed in the first embodiment of the invention.

When fabricating the laser in the structure of FIG. 1(h), after three times of crystal growth in the same manufacturing steps as in the conventional laser fabrication process, only a step of forming insulating film in a pair of grooves formed by forming grooves at both sides of the stripes by etching is added, and it may be easily realized in exactly the same technique as in the conventional method of crystal growth.

Figure 2B:
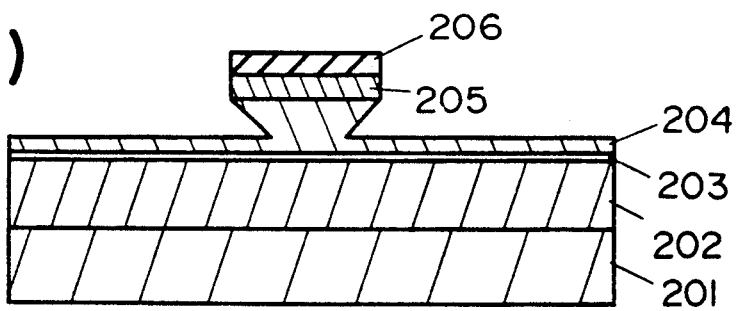
Figure 2C:
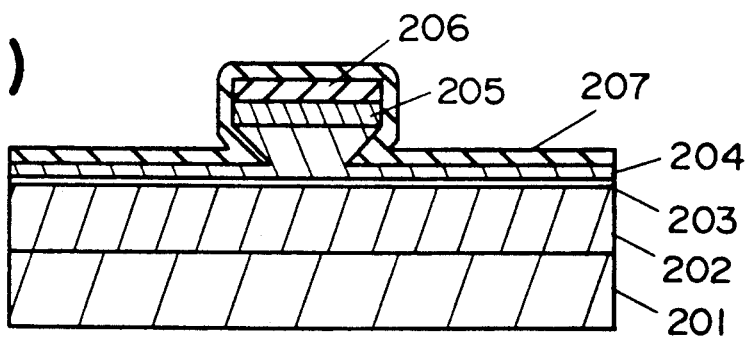
Figure 2D:
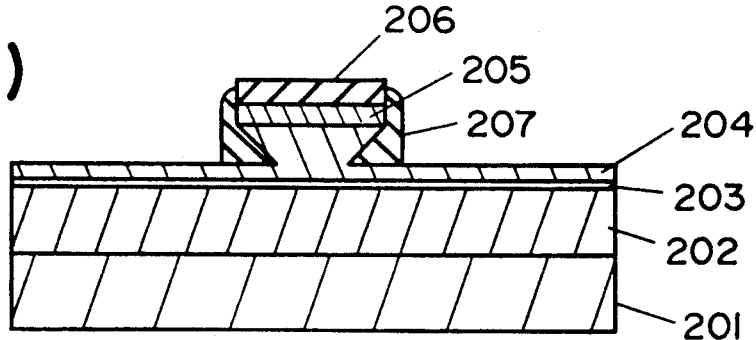
Figure 2E:
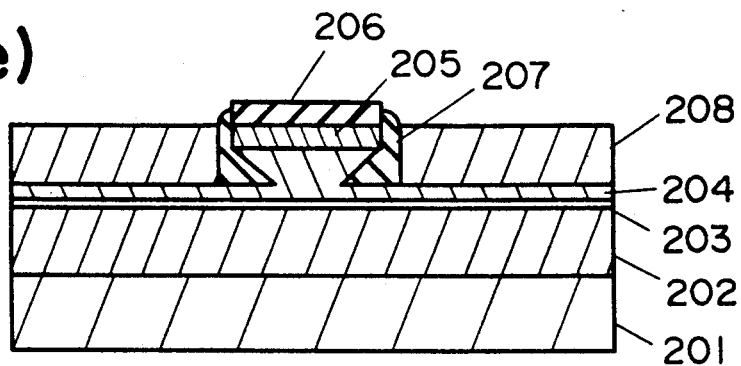
Figure 2F:
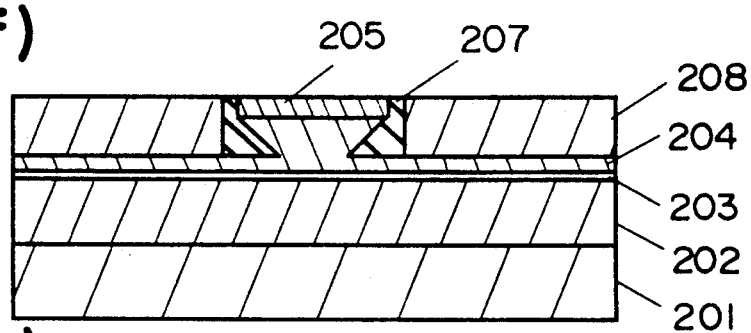
Figure 2G:
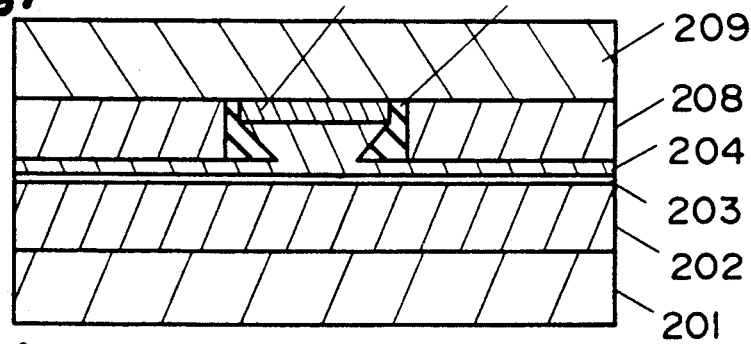
Figure 2H:
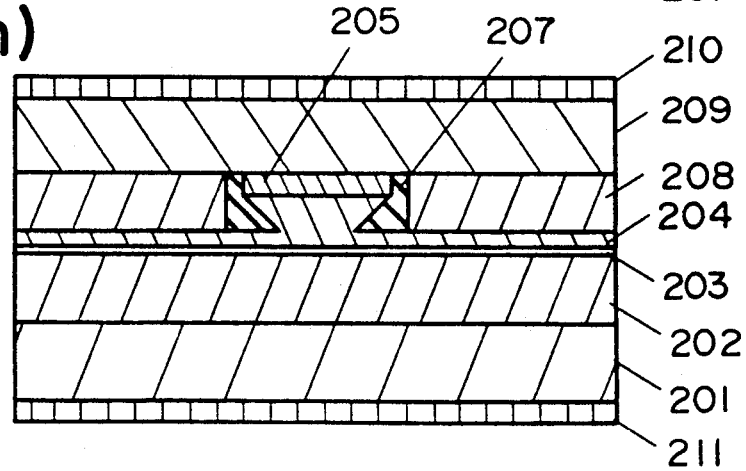

FIGS. 2(a)-2(h) show a schematic sectional structural drawing in the manufacturing steps of an AlGaInP semiconductor laser in accordance with a second embodiment of the present invention. First, as shown in FIG. 2(a), on the surface of an n-type GaAs substrate 201 having (100) plane, for example, as the principal plane, an n-type AlGaInP cladding layer 202 (for example, $x=0.6$, carrier density $5\times10^{17}$ cm$^{-3}$, thickness 1 μm), a GaInP active layer 203 (for exmaple, thickness 0.2 μm), a p-type AlGaInP cladding layer 204 (for example, $x=0.6$, carrier density $1\times10^{18}$ cm$^{-3}$, thickness 0.7 μm), and a p-type GaInP buffer layer 205 (for example, carrier density $3\times10^{18}$ cm$^{-3}$, thickness 0.3 μm) are sequentially formed by crystal growth by lattice matching with the n-type GaAs substrate 201 by the MOVPE method. Next, using an SiO$_2$ film 206 formed in stripes in a width of, for example, 4 μm, in, say, the $<01\bar{1}>$ direction as the mask, the p-type GaInP buffer layer 205 is etched by RIE using, say, CCl$_4$ gas, and further the p-type AlGaInP cladding layer 204 is etched for, say, 4 minutes in sulfuric acid at, say, 40° C. to leave the p-type AlGaInP cladding layer 204 in a thickness of 0.3 μm at the outer side of the stripes, so that the result becomes as shown in FIG. 2(b). In this embodiment, since the stripes are formed in the $<01\bar{1}>$ direction, the p-type AlGaInP cladding layer 204 at both sides of the stripes is etched in a dovetail-shaped mesa profile. Consequently, by a method of depositing insulating films efficiently even on the side face of step such as the photo-CVD (chemical vapor deposition) method, an insulating film lower in refractive index than the p-type AlGaInP cladding layer 204, for example, an Si$_3$N$_4$ film 207 in a thickness of 0.3 μm is deposited, so that the insulating film may be also deposited on the side face of the dovetail-shaped mesa as shown in FIG. 2(c). Next, by RIE or RIBE (reactive ion beam etching), when the entire surface is etched by using etching gas such as CF$_4$, the Si$_3$N$_4$ film 207 deposited on the side face of the step and on the dovetail-shaped mesa surface is not etched and is left over due to the anisotropy of etching, thereby becoming as shown in FIG. 2(d). When, by the MOVPE method, when crystal growth is effected selectively only on the surface of the p-type AlGaInP cladding layer 204 having the n-type GaAs current blocking layer 208 exposed on the surface, the deposited Si$_3$N$_4$ film 207 is buried in the side face of the step and the dovetail-shaped mesa surface as shown in FIG. 2(e). Next, the SiO$_2$ film 206 exposed on the surface is etched and removed by using a mixed solution of HF:H$_2$O=1:10, and the surface of the p-type GaInP buffer layer 204 is exposed as shown in FIG. 2(f). Furthermore, when a p-type GaAs contact layer 209 (for example, carrier density $5\times10^{18}$ cm$^{-3}$, thickness 3 μm) is formed on the entire surface by MOVPE crystal growth, stripes are buried as shown in FIG. 2(g). Finally, a p-type ohmic contact electrode 210 of Au/Zn/Au is formed on the entire surface, and the back surface is polished and etched to make the substrate thin, and an n-type ohmic contact electrode 211 made of Au-Ge/Ni/Au is formed, so that the AlGaInP semiconductor laser of the present second embodiment of the invention is completed as shown in FIG. 2(h).

What is characteristic of the second embodiment of the present invention is, structurally, that, same as in the first embodiment, the insulating film smaller in refractive index than the AlGaInP cladding layer is formed at both sides of the stripes, so that the light may be confined and guided also in a direction parallel to the active layer, and therefore the refractive index guiding is effected both in the direction parallel to the active layer and in the direction vertical thereto, and the astigmatism is far smaller than in the conventional laser. Besides, the thermal conductivity of the Si$_3$N$_4$ film buried at both sides of the stripes is lower than that of GaAs, but in the second embodiment of the invention, since the Si$_3$N$_4$ film formed on the side face and dovetail-shaped mesa surface of the stripe can be selectively left over by the anisotropy of etching without requiring the present mask alignment step, the width can be narrowed, and since the Si$_3$N$_4$ film is buried only in the portion at both sides of the stripes, and the outer side is the n-type GaAs current blocking layer, so that the release of the heat generated in the vicinity of the active layer is not impaired by the Si$_3$N$_4$ film. Moreover, since the p-type AlGaInP cladding layer 204 is etched in the dovetail-shaped mesa shape, the current confinement effect is greater. Incidentally, in the laser shown in the prior art, when the stripe direction is the <01$\bar{1}$> direction, and the p-type AlGaInP layer is in dovetail-shaped mesa, the n-type GaAs current blocking layer is likely to absorb the light generated in the present active layer, and therefore the loss of light is greater and the oscillation threshold becomes higher. Therefore, the structure of the second embodiment of the invention is effective only when the insulating film extremely small in the light absorption coefficient is used.

An important feature in the manufacturing process of the second embodiment of the invention is that the process is simple and that the width can be narrowed because the Si$_3$N$_4$ film 207 can be selectively left over on the stripe side face and dovetail-shaped mesa surface by the anisotropy of etching without requiring mask matching step. Moreover, since the width of the Si$_3$N$_4$ film 207 formed on the stripe side face and the dovetail-shaped mesa surface is nearly same as the film thickness, the p-type GaAs contact layer 209 is easily connected on the Si$_3$N$_4$ film 207 even in the case of crystal growth of p-type GaAs contact layer 209, and therefore the contact area between the p-type GaAs contact layer 209 and the p-side ohmic contact electrode 210 can be widened, so that the contact resistance may be lowered.

A further different feature of the first and second embodiments of the invention is that the GaAs layer 107 or 208 for absorbing the light generated in the active layer is disposed in the region outside the insulating film 104 or 207 smaller in refractive index than the cladding layer disposed at both sides of the stripes. In other words, the lateral mode which is the distribution of the guided mode in the plane parallel to the active layer increases in the leak of light into both sides of the stripes as the mode becomes higher order, while the light confinement effect into the inside of the stripes becomes smaller. Therefore, in the semiconductor laser in the first and second embodiments of the invention, as the lateral mode becomes higher order, the quantity of light absorbed in the GaAs layer 107 or 208 becomes larger. Accordingly, the higher lateral mode is likely to be suppressed so as to oscillate in the fundamental mode, so that kink of optical output vs. current characteristic derived from mode hopping hardly occurs, thereby obtaining stable operations.

Figure 3A:
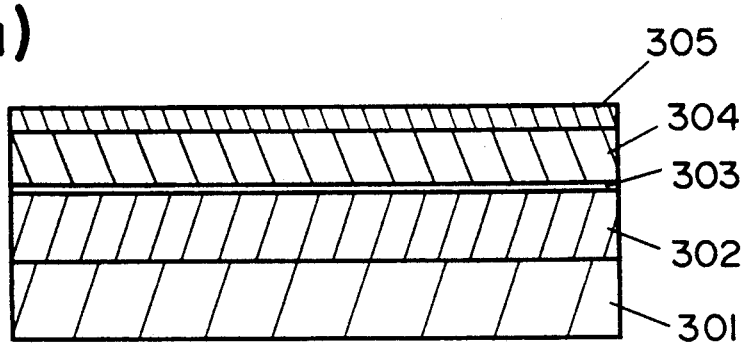
Figure 3B:
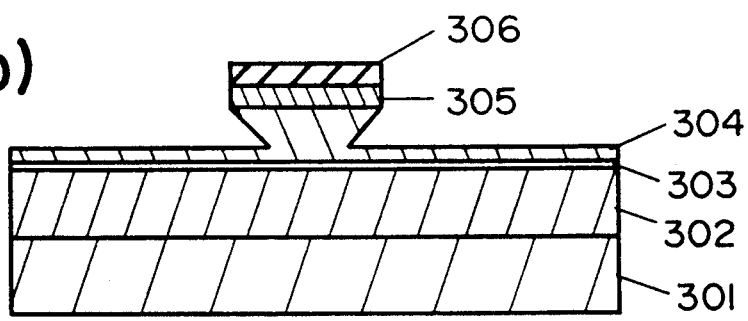
Figure 3C:
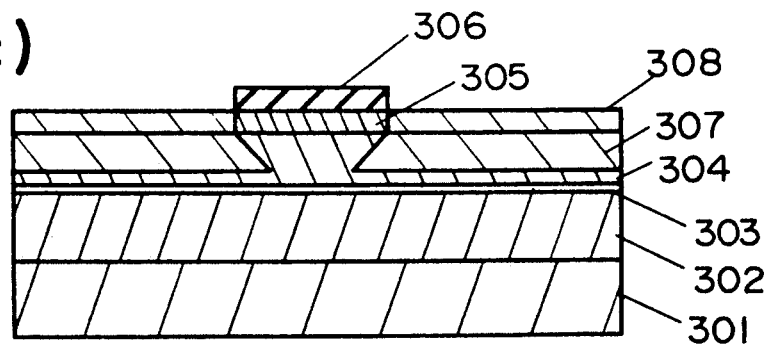
Figure 3D:
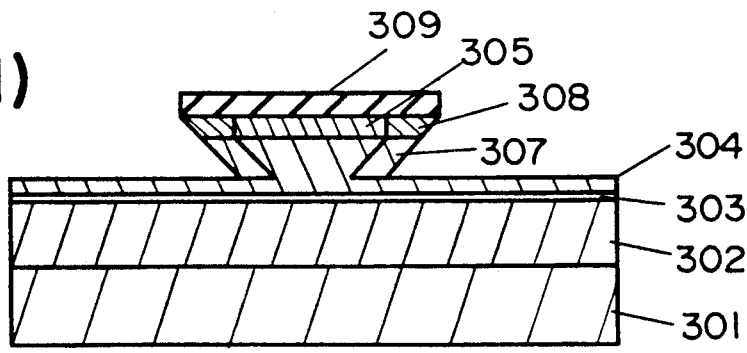
Figure 3E:
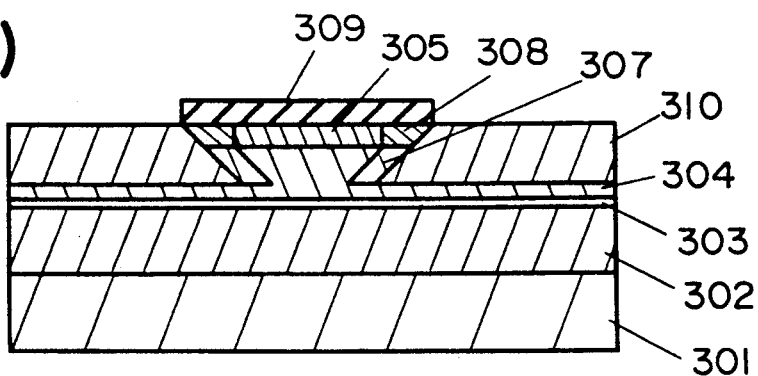
Figure 3F:
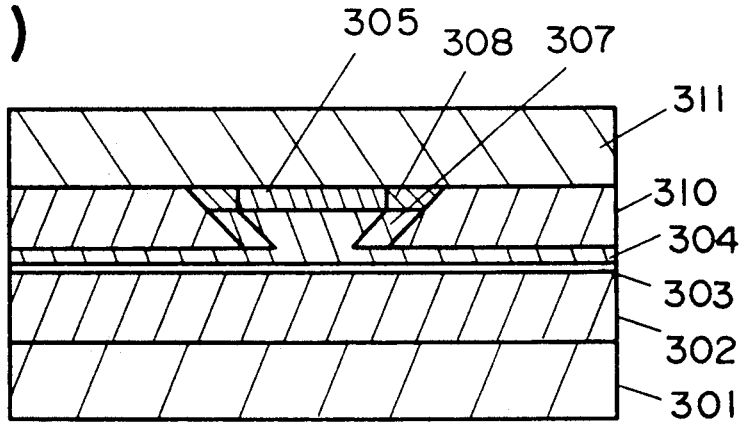
Figure 3G:
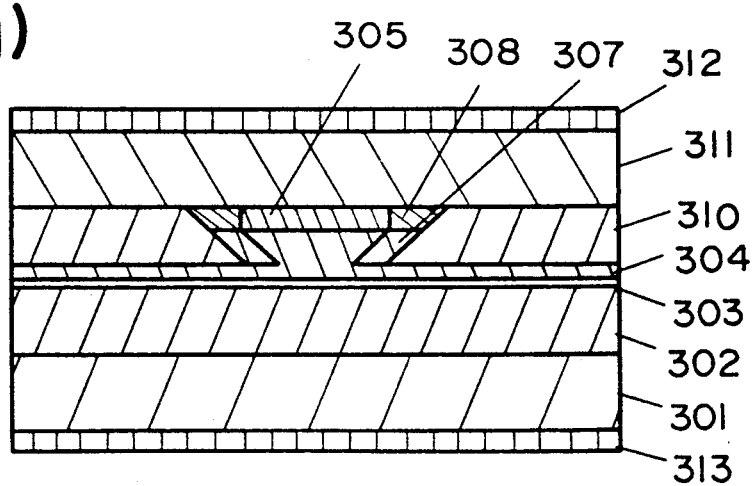

FIGS. 3(a)–3(g) show schematic sectional structural drawings in manufacturing steps of an AlGaInP semiconductor laser in accordance with a third embodiment of the present invention. First, as shown in FIG. 3(a), on the surface of an n-type GaAs substrate 301 having, for example, (100) plane as the principal plane, an n-type AlGaInP cladding layer 302 (for example, x=0.6, carrier density $5 \times 10^{17}$ cm$^{-3}$, thickness 1 μm), a GaInP active layer 303 (for example, thickness 0.2 μm), a p-type AlGaInP cladding layer 304 (for example, x=0.6, carrier density $1 \times 10^{18}$ cm$^{-3}$, thickness 0.7 μm), and a p-type GaInP buffer layer 305 (for example, carrier density $3 \times 10^{18}$ cm$^{-3}$, thickness 0.3 μm) are sequentially grown epitaxially by the MOVPE method by lattice matching with the n-type GaAs substrate 301. Next, using an SiO$_2$ film 306 formed in stripes in a width of, for example, 4 μm in, say, <01$\bar{1}$> direction as the mask, the p-type GaInP buffer layer 305 is etched by RIE using, for example, CCl$_4$ gas, and the p-type AlGaInP cladding layer 304 is also etched for, say, 4 minutes in sulfuric acid at, say, 40° C., thereby leaving the p-type AlGaInP cladding layer 304 at the outer side of the stripe in a thickness of 0.2 μm, so that the result may be as shown in FIG. 3(b). In this embodiment, since the stripes are formed in the <01$\bar{1}$> direction, the p-type AlGaInP cladding layer 304 at both sides of the stripes is etched in a dovetail-shaped mesa profile. Next, using an SiO$_2$ film 306 as a mask for selective growth, a p-type AlInP layer 307 (for exmaple, carrier density $5 \times 10^{17}$ cm$^{-3}$, thickness 0.5 μm) and p-type GaAs layer 308 (for example, carrier density $5 \times 10^{18}$ cm$^{-3}$, thickness 0.3 μm) lower in refractive index than the p-type AlGaInP cladding layer 304 are epitaxially grown, thereby resulting in FIG. 3(c). Consequently, on the surface of a p-type GaAs layer 308, an SiO$_2$ film 309 is formed in stripes in a width of, for example, 8 μm, and using the SiO$_2$ film 309 as the mask, the p-type GaAs layer 308 is etched for 30 seconds in a mixed solution of, for exmaple, H$_2$SO$_4$:H$_2$O$_2$:H$_2$O=1:1:10, and furthermore the p-type AlInP layer 307 is etched in sulfuric acid at, say, 30° C., so that the p-type AlInP layer 307 is formed in the dovetail-shaped mesa profile at the side face of the p-type AlGaInP cladding layer 304 in dovetail-shaped mesa form. Then, using the SiO$_2$ film 309 as the mask for selective growth, and n-type GaAs current blocking layer 310 is epitaxially grown, which becomes as shown in FIG. 3(e). After removing the SiO$_2$ film 309, a p-type GaAs contact layer 311 (for example, carrier density $5 \times 10^{18}$ cm$^{-1}$, thickness 3 μm) is epitaxially grown on the entire surface by the MOVPE method, and the stripes are buried as shown in FIG. 3(f). Finally, a p-type ohmic contact electrode 312 made of Cr/Au is formed on the surface, and the back surface is polished and etched to reduce the thickness of the substrate, and an n-type ohmic contact electrode 313 made of Au-Ge/Ni/Au is formed, so that an AlGaInP semiconductor laser of the third embodiment of the invention is completed as shown in FIG. 3(g).

Incidentally, in the third embodiment of the present invention, instead of the p-type AlInP layer 307, a p-type AlGaInP lower in refractive index than the p-type AlGaInP cladding layer ma be also used.

What is characteristic of the third embodiment of the present invention is, structurally, that the p-type AlGaInP or p-type AlInP layer 307 smaller in refractive index than the p-type AlGaInP cladding layer 304 is formed at both sides of the stripes, so that the light may be confined and guided also in a direction parallel to the active layer, and furthermore since the current is injected into the active layer also from the p-type AlGaInP or p-tye AlInP layer 307 smaller in refractive index, if the refractive index of the active layer should be lowered by the current injection, the difference in refractive index between inside and outside (the region of forming the p-type AlInP layer 307) of the stripes of the AlGaInP cladding layer 304 hardly changes, so that effects on the guided mode are slight. Therefore, since the light is index-guided stably both in the direction parallel to the active layer and in the direction vertical thereto, the astigmatism is far smaller than in the conventional laser. The thermal conductivity of the p-type AlInP layer buried at both sides of the stripes is 0.09 W/cm.deg., which is lower than 0.54 W/cm.deg. of GaAs, but in the third embodiment of the invention, the p-type AlInP layer is buried only in the portion of the grooves at both sides of the stripes, and the outer side thereof is an n-type GaAs current blocking layer, and hence the release of heat generated in the vicinity of the active layer is not impaired by the p-type AlInP layer. Moreover, in the third embodiment of the present invention, when the p-type GaAs contact layer 311 is epitaxially grown, the surface becomes flat, and the contact area with the p-type ohmic contact electrode 312 is wider, and therefore the contact resistance can be easily lowered.

One of the features of the present third embodiment of the invention in its manufacturing process is that the side surface of the p-type AlGaInP or p-type AlInP layer 307 smaller in refractive index than the p-type GaInP cladding layer 304 formed on the dovetail-shaped mesa side surface is also in dovetail-shaped mesa profile, so that the width can be narrowed. Therefore, by narrowing the stripe width of index-guiding, the stripe width of current injection can be narrowed simultaneously, so that single lateral mode oscillation may be obtained at low threshold current.

Figure 4A:
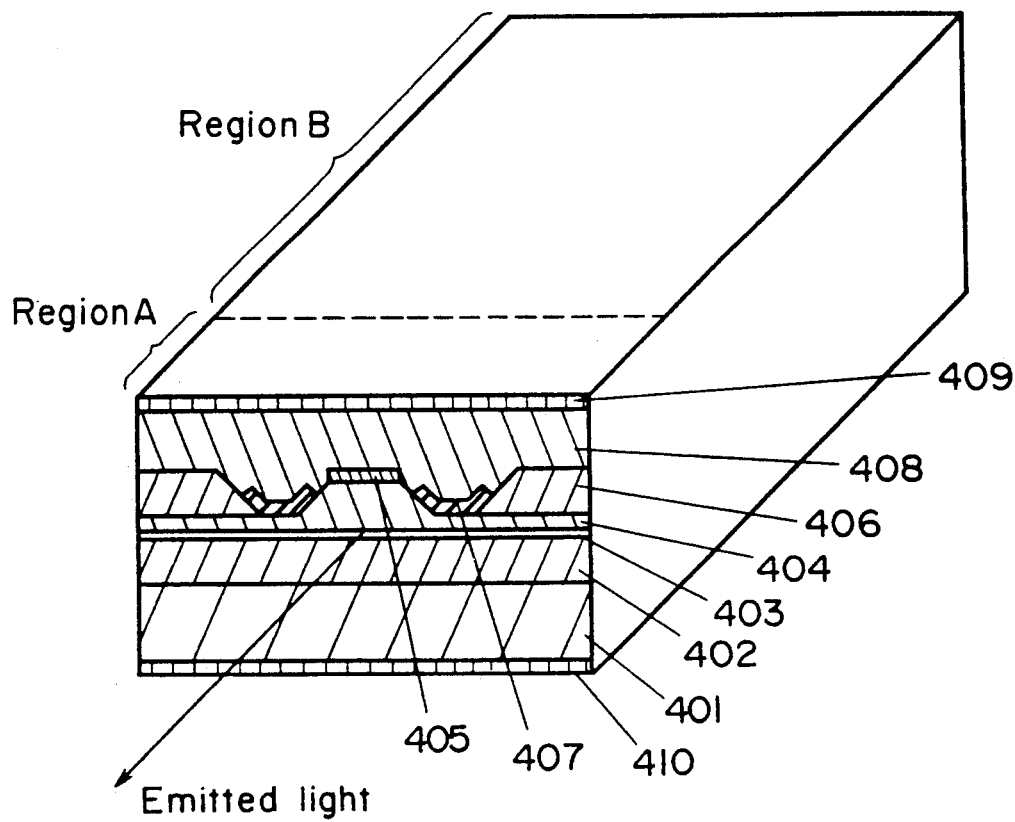
FIGS. 4(a)–4(b) and 5(a)–5(b) respectively show semiconductor laser structures in accordance with the fourth and fifth embodiments of the present invention.
Figure 4B:
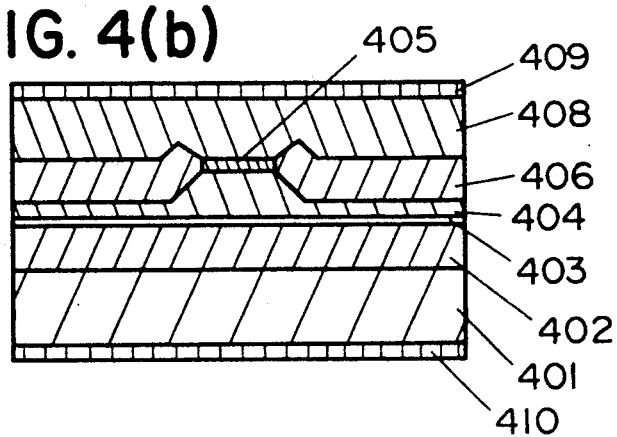

A fourth embodiment of the present invention is shown in FIGS. 4(a) and 4(b). In FIGS. 4(a) and 4(b), numeral 401 denotes an n-type GaAs substrate, 402 is an n-type AlGaInP cladding layer, 403 is a GaInP active layer, 404 is a p-type AlGaInP cladding layer, 405 is a p-type GaInP buffer layer, 406 is an n-type GaAs current blocking layer, 407 is an $Si_3N_4$ film, 408 is a p-type GaAs contact layer, 409 is a p-side ohmic contact electrode, and 410 is an n-side ohmic contact electrode. In FIGS. 4(a) and 4(b), the laser sectional structure differs between region A and region B, and the sectional structure of region A is same as the structure of the first embodiment of the present invention, while the sectional structure of region B is same as the structure in the prior art.

Characteristically of the fourth embodiment of the present invention, since the insulating film 407 lower in refractive index than the cladding layer is disposed at both sides of the stripes in region A, the guided light is completedly confined within the stripes, and therefore the light is index-guided both in the direction parallel to the active layer and in the direction vertical thereto in region A, and the light emitted from region A is small in the astigmatism, and what is more, in region B, since the same gain guided component as in the prior art remains, the longitudinal mode of the laser oscillation is a multimode. As a result, the semiconductor laser in accordance with the fourth embodiment of the present invention may operate stably without being so much affected by the disturbance such as feedback light. Moreover, the semiconductor laser of the fourth embodiment of the present invention may be easily fabricated by combining the fabricating methods of the prior art and the first embodiment of the present invention.

Meanwhile, in the explanation of the first, second and fourth embodiments of the present invention, the $Si_3N_4$ film is shows as the insulating film to be formed at both sides of the stripes, but it may be replaced, needless to say, by other insulating film such as an $SiO_2$ film and an $Al_2O_3$ film.

Figure 5A:
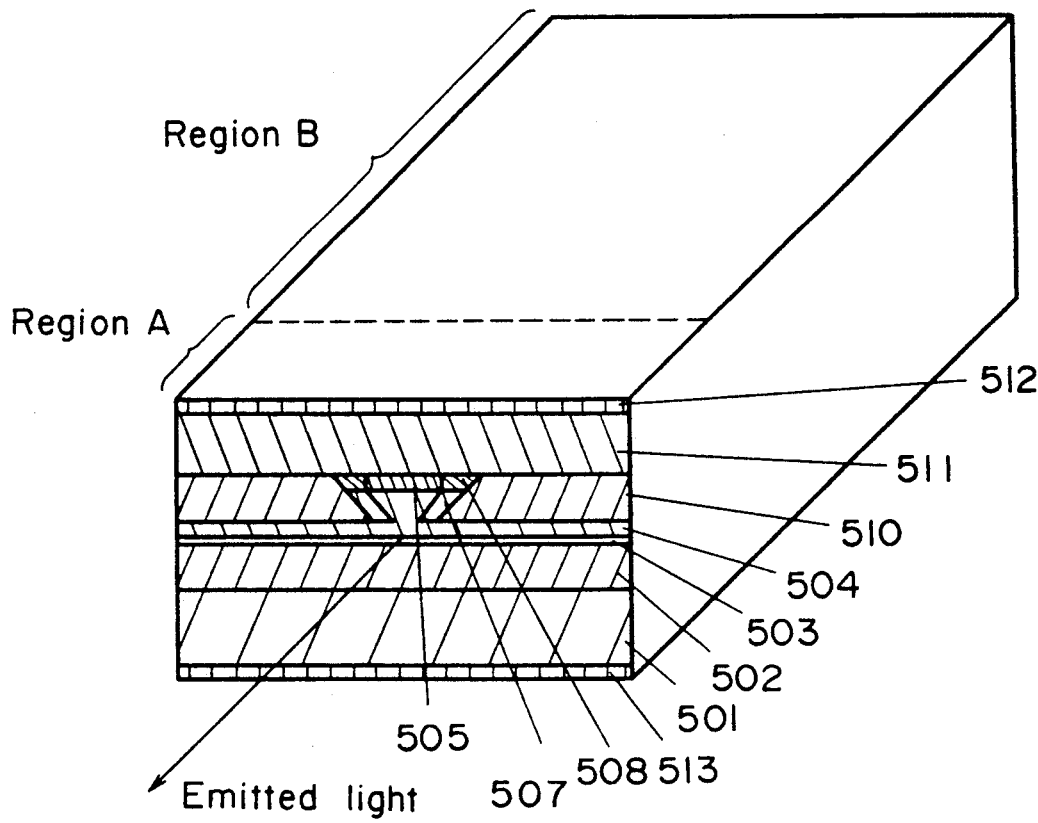
Figure 5B:
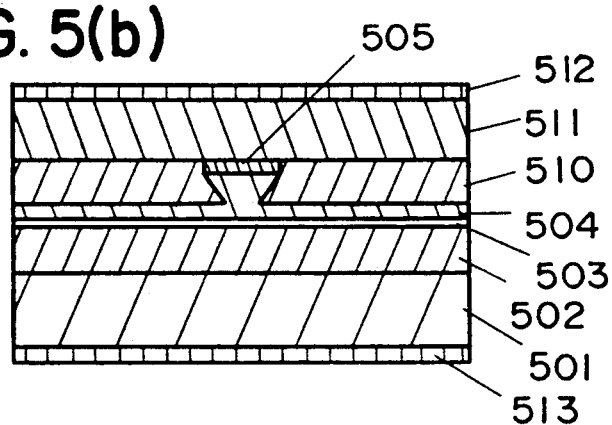

A fifth embodiment in accordance with the present invention is shown in FIGS. 5(a) and 5(b). In FIGS. 5(a) and 5(b), numeral 501 denotes an n-type GaAs substrate, 502 is an n-type AlGaInP cladding layer, 503 is a GaInP active layer, 504 is a p-type AlGaInP cladding layer, 505 is a p-type GaInP buffer layer, 507 is a p-type AlInP layer, 510 is an n-type GaAs current blocking layer, 511 is a p-type GaAs contact layer, 512 is a p-side ohmic contact electrode, and 513 is an n-side ohmic contact electrode. In FIGS. 5(a) and 5(b), the sectional structure of the laser differs between region A and region B, and the sectional structure of region A is smae as the structure of the third embodiment, while the sectional structure of region B is same as the structure of the prior art.

Characteristically of the fifth embodiment of the present invention, in region A, since the p-type AlInP layer 507 lower in refractive index than the p-type AlGaInP cladding layer 504 is disposed at both sides of the stripes, the guided light is completely confined within the stripes, and therefore, the light index-guided both in the direction parallel to the action layer and in the direction vertical thereto in region A, so that the light emitted form region A is small in the astigmatism, while, in region B, the same gain guided component as in the prior art remains, so that the longitudinal mode of laser oscillation is a multimode. As a result, the semiconductor laser of the fifth embodiment of the present invention can operate stably without being so much affected by disturbance such as feedback light. The semiconductor laser of the fifth embodiment may be fabricated by combining the fabrication methods of the prior art and the third embodiment.

Meanwhile, in the third (or fifth) embodiment of the present invention, instead of the p-type AlGaInP or p-type AlInP layer 307 (or 507) smaller in refractive index than the p-type AlGaInP cladding layer 304 (or 504) formed on the dovetail-shaped mesa side surface, a semi-insulating AlGaInP or semi-insulating AlInP layer or n-type AlGaInP or n-type AlInP layer may be formed.

In this case, the semi-insulating or n-type AlGaInP or AlInP layer plays the role of blocking the current flowing into other portion than the stripes, as well as confinement of the light into the stripes by the refractive index. If it is enough to play such role alone, in FIGS. 3(a)-3(g), the portion of the n-type GaAs current blocking layer may be made of semi-insulating or n-type AlGaInP or AlInP layer, but since the thermal conductivity of the AlInP layer is 0.09 W/cm.deg., being lower than 0.54 W/cm.deg. of GaAs, the heat release becomes poor. In this invention, since the n-type GaAs current blocking layer 310 (or 510) is disposed almost over the entire surface at both sides of the stripes, the heat release is smooth.

Incidentally, in the third and fifth embodiments of the present invention, the stripe direction is the <01$\bar{1}$> direction, but when the stripe direction is the <011> direction, the stripe is the trapezoidal normal mesa, instead of the dovetail-shaped mesa, but the same effect is obtained.

Figure 6A:
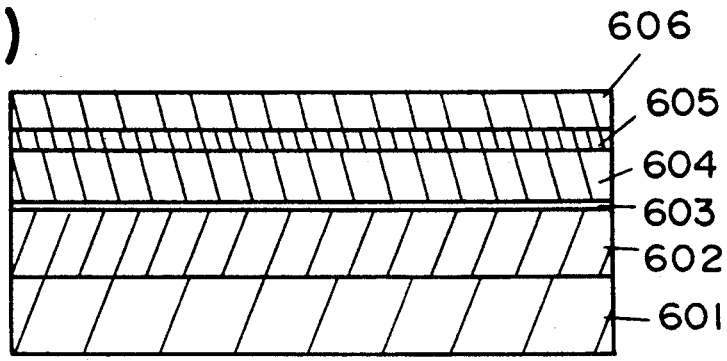
Figure 6B:
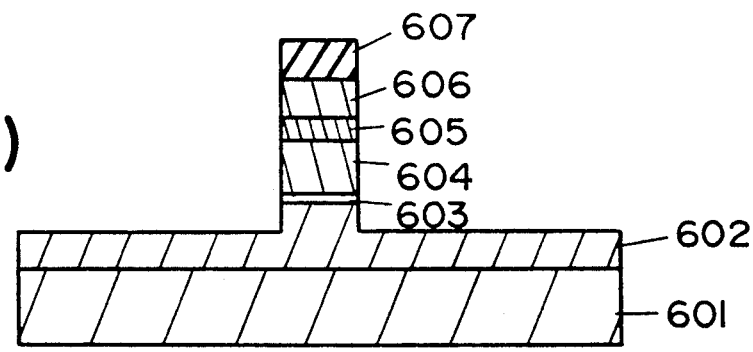
Figure 6C:
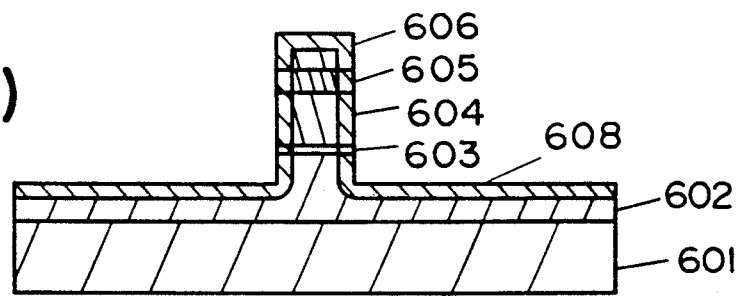
Figure 6D:
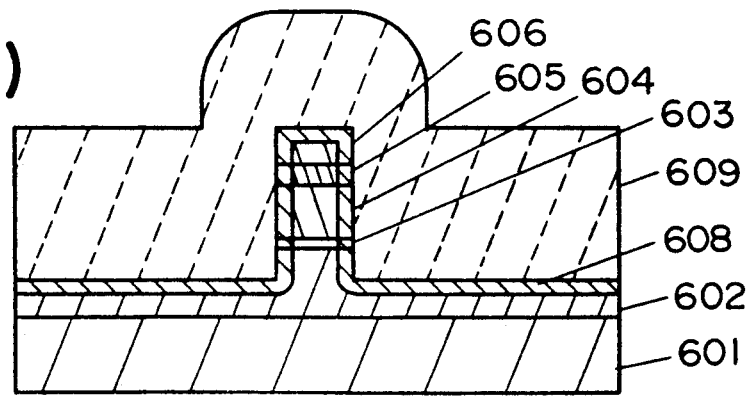
Figure 6E:
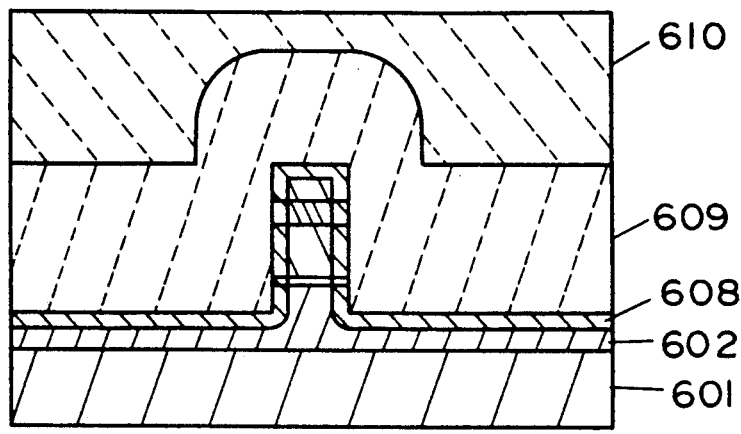
Figure 6F:
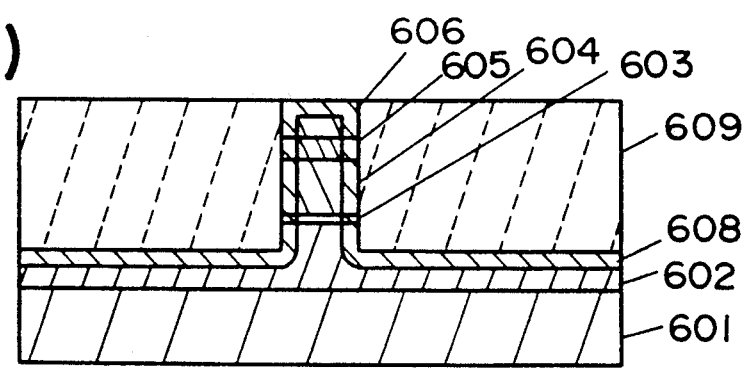
Figure 6G:
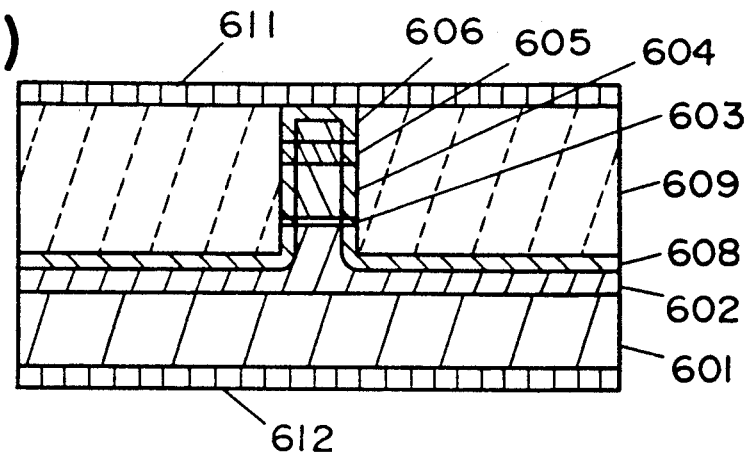
Figure 7A:
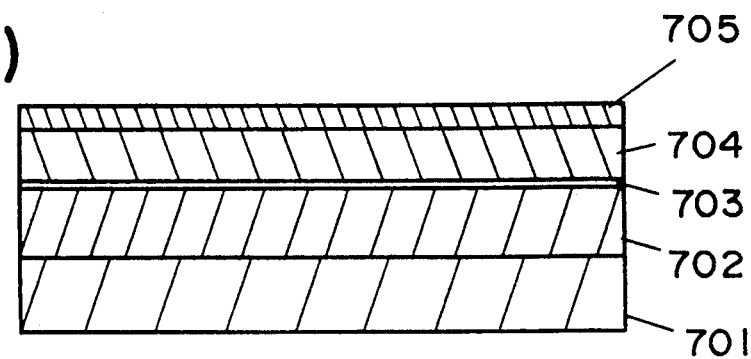
FIGS. 7(a)–7(e) show schematic sectional structural drawings in the manufacturing steps of a conventional lateral mode controlled AlGaInP semiconductor laser.
Figure 7B:
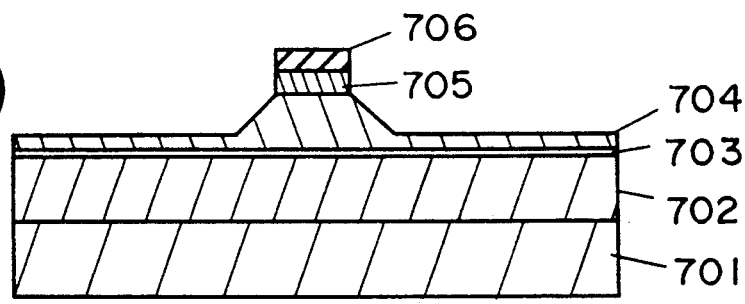
Figure 7C:
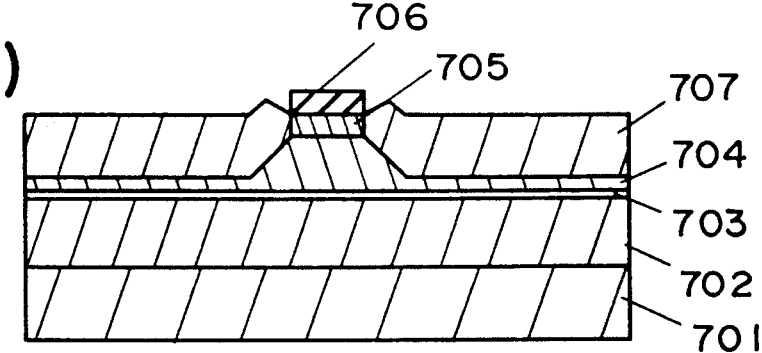
Figure 7D:
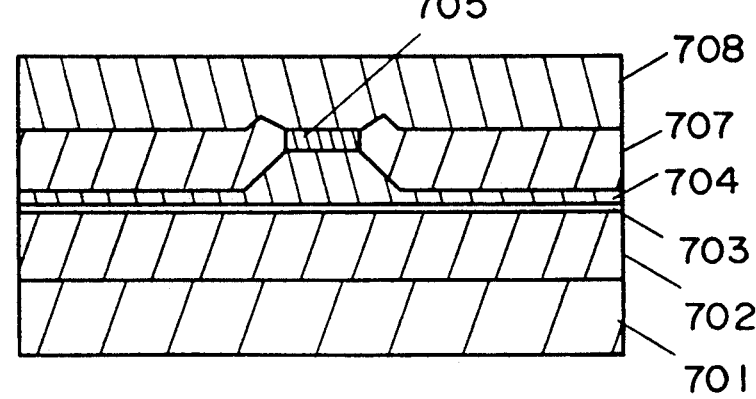
Figure 7E:
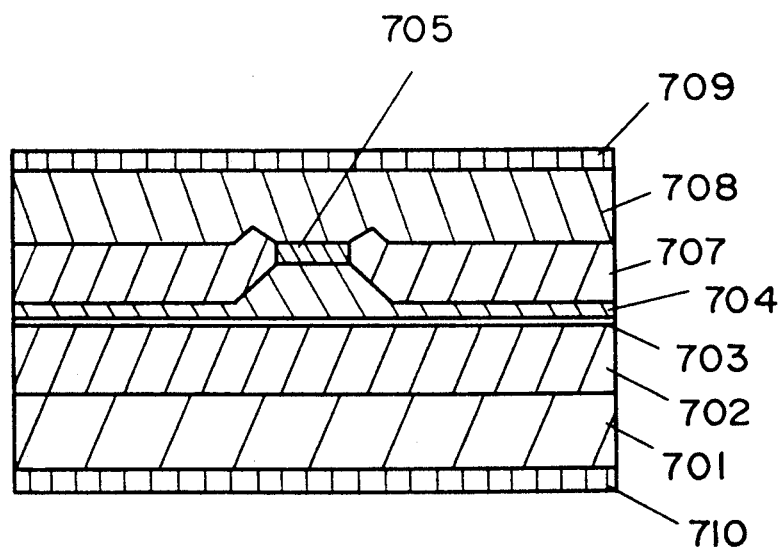

FIGS. 6(a)-6(g) show schematic sectional structural drawings in manufacturing steps of an AlGaInP semiconductor laser in accordance with a sixth embodiment of the present invention. First, as shown in FIG. 6(a), on the surface of an n-type GaAs substrate 601, an n-type AlGaInP cladding layer 602 (for example, x=0.6, carrier density $5\times10^{17}$ cm$^{-3}$, thickness 1 μm), a GaInP active layer 603 (for example, thickness 0.1 μm) a p-type AlGaInP cladding layer 604 (for example, x=0.6, carrier density $1\times10^{18}$ cm$^{-3}$, thickness 0.7 μm), p-type GaInP buffer layer 605 (for example, carrier density $3\times10^{18}$ cm$^{-3}$, thickness 0.3 μm), and p-type GaAs contact layer 606 (for example, carrier density $5\times10^{18}$ cm$^{-2}$, thickness 1 μm) are sequentially formed epitaxially by the MOVPE method by lattice matching with the n-type GaAs, substrate 601. Next, using a stripe-formed SiO$_2$ film 607 as mask, the p-type GaInP buffer layer 605, p-type AlGaInP cladding layer 604, GaInP active layer 603, and part of n-type AlGaInP cladding layer 602 are etched by reactive ion etching (RIE) using, for example, Cl$_2$ gas, and ridges are formed as shown in FIG. 6(b). Next, as shown in FIG. 6(c), for example, by the closed tube diffusion technique, Zn which is a p-type impurity is diffused on the entire surface using ZnP$_2$ as diffusion source of the impurity, and a p-type diffusion layer 608 is formed. This is the diffusion for preventing exposure of the pn junction in the vicinity of the active layer on the surface, and the diffusion depth of the p-type diffusion layer 608 is as shallow as about 0.2 μm. Then, using a film lower in refractive index than the p-type AlGaInP cladding layer 604 or n-type AlGaInP cladding layer 602, an amorphous film 609 comprising amorphous Si and Si$_3$N$_4$ is deposited in a thickness of, for example, 3 μm as shown in FIG. 6(d) by, for example, reactive sputter evaporation using a mixed gas of Ar and trace of N$_2$, having Si as target. When the refractive index of the amorphous film is desired to be, for example, 3.2, the refractive index of amorphous Si at wavelength of 0.67 μm is 3.4, and the refractive index of Si$_3$N$_4$ is 2.0, and hence the composition ratio of the amorphous Si and Si$_3$N$_4$ is 0.86:0.14. Next, for example, when the photoresist is coated by spinner in a thickness of 3 μm, as shown in FIG. 6(e), the surface is flattened. Consequently, by the RIE method, using a mixed gas of, for example, CF$_4$ and O$_2$ as etching gas, when the entire surface is etched at a same etching rate on the photoresist 610 and amorphous film 609, the surface of the p-type GaAs contact layer 606 is exposed as shown in FIG. 6(f). Finally, when a p-type ohmic contact electrode 611 made of Cr/Au/Pt/Au is formed on the surface, and the back surface is polished and etched to thin out the substrate, and then an n-type ohmic contact electrode 612 made of Au-Ge/Ni/Au is formed, the AlGaInP semiconductor laser of the sixth embodiment of the present invention is completed as shown in FIG. 6(g).

What is characteristic of the sixth embodiment of the present invention is, structurally, since the amorphous film smaller in refractive index than the AlGaInP cladding layer is formed at both sides of the stripes, the light can be guided as being confined also in the direction parallel to the active layer, and therefore the light is index-guided both in the direction parallel to the active layer and in the direction vertical thereto, so that the astigmatism is far smaller than in the conventional laser. The thermal conductivity of the amorphous film 609 formed on both sides of the stripes is an intermediate value between 1.5 W/c.deg. of the amorphous Si and 0.12 W/cm.deg. of Si$_3$N$_4$ film, and when the composition ratio is selected, for example, so that the refractive index of the amorphous film 609 may be 3.2, the thermal conductivity is 1.3 W/cm.deg., which is a higher value than 0.54 W/cm.deg. of GaAs, so that the release of heat generated in the vicinity of the active layer is better than in the prior art. Besides, the amorphous film is highly resistive, and electrically acts as a current blocking layer. In the above explanation, as the amorphous film, a mixture of amorphous Si and Si$_3$N$_4$ is mentioned as an example, but the same effect is obtained, as a matter of course, when reactive sputter evaporation is effected by using O$_2$ instead of N$_2$ to deposit the mixture of amorphous Si and SiO$_2$. Likewise, it is also the same when the mixture of AlN and Al$_2$O$_3$ obtained by reactive sputter evaporation by a mixed gas of N$_2$ and O$_2$ is used as the amorphous layer, having Al as target. Still more, when using as a current blocking layer, amorphous ZnSe or ZnS may be also applicable.

A main feature in the manufacturing process of this embodiment is that epitaxial growth is required only once, so that the element may be fabricated easily.

In the foregoing first to sixth embodiments of the present invention, GaInP is used as the active layer, but it may be replaced by AlGaInP. Needles to say, the conductive type may be exchanged between p-type and n-type.

Moreover, in the first to sixth embodiments of the present invention described herein, the p-type GaInP layer is formed on the surface of p-type AlGaInP cladding layer, but this is inserted only to reduce the barrier effect of the current by the spikes in the valence electron band existing in the heterojunction interface on the interface between the p-type AlGaInP cladding layer and p-type GaInP layer or on the interface between p-type GaInP layer and p-type GaAs layer, and therefore the p-type GaInP layer is not needed when the carrier density of these layers is raised. Needless to say, the conductive type may by inverted in the first to sixth embodiments of the present invention.

As explained herein, the present invention provides the following effects.

In the structures in the first, second and fourth embodiments of the present invention, an insulating film smaller in refractive index than the AlGaInP cladding layer is formed at both sides of the stripes, the light can be entrapped and guided also in the direction parallel to the active layer, and therefore, the light is index-guided not only in the direction parallel to the active layer but also in the direction vertical thereto, so that the astigmatism becomes far smaller than in the laser of the prior art. Still more, the current blocking layer outside the insulating film is high in thermal conductivity, and the heat generated in the vicinity of the active layer may be dissipated efficiently.

In the third embodiment of the present invention, since the AlGaInP or AlInP layer smaller in refractive index than the p-type AlGaInP cladding layer is formed at both sides of the stripes, the light can be confined and guided also in the direction parallel to the active layer, and moreover, since the n-type GaAs current blocking layer is formed at the outer side thereof, the heat release is better as compared with the case of using AlGaInP or AlInP layer as current blocking layer. Furthermore, when the AlGaInP or AlInP layer smaller in refractive index than AlGaInP cladding layer at both sides of the stripes is of p-type, the light can be confined and guided also in the direction parallel to the active layer, and further the current is injected into the active layer also from the p-type AlGaInP or p-type AlInP layer smaller in refractive index, so that the effect on the guided mode is small even if the refractive index of the active layer is lowered by current injection. Therefore, both in the direction parallel to the active layer and in the direction vertical thereto, index-guiding is effected stably, and the astigmatism is far smaller than in the laser shown in the prior art. What is more, since the current blocking layer outside the AlGaInP or AlInP layer small in refractive index is high in thermal conductivity, the heat generated in the vicinity of the active layer can be efficiently dissipated.

In the structures of the fourth and fifth embodiments of the present invention, in the vicinity of the output facet of the laser, since the insulating film smaller in refractive index than the cladding layer and the AlGaInP or AlInP layer smaller in refractive index than the cladding layer are disposed at both side of the stripes, the guided light is completely confined within the stripes, and the output light is small in astigmatism, and still more in the region other than the region in which the insulating film is buried, the same gain guided component as in the prior art is left over, so that the longitudinal mode of the laser oscillation is a multimode. As a result, the semiconductor laser can operate stably without being so much affected by disturbance such as feedback light.

In the structure of the sixth embodiment of the present invention, since an amorphous film smaller in refractive index than the AlGaInP cladding layer is formed at both sides of the stripes, the light can be confined and guided also in the direction parallel to the active layer, and therefore the light is index-guided not only in the direction parallel to the active layer but also in the direction vertical thereto, so that the astigmatism may be far smaller than in the conventional laser. Moreover, since the thermal conductivity of the amorphous film such as amorphous Si is high, the heat generated in the vicinity of the active layer may be released smoothly. Yet, the amorphous film is highly resistive, and acts as a current blocking layer electrically.

In the manufacturing method of the first embodiment of the present invention, after epitaxial growth of n-type GaAs current blocking layer, the stripe-shaped p-type GaInP buffer layer and p-type AlGaInP cladding layer can be formed by selective etching, and therefore selective growth of crystal is not needed.

According to the manufacturing method of the second embodiment of the invention, since the insulating film may be selectively left over by the anisotropy of etching, without requiring the step of mask matching to the stripe side face and dovetail-shaped mesa surface, the process is simple, and the width can be narrowed. Besides, since the width of the insulating film formed on the stripe side surface and dovetail-shaped mesa surface is nearly same as the film thickness, the p-type GaAs contact layer can be easily connected on the insulating film also in the event of epitaxial growth of the p-type GaAs contact layer, and therefore the contact area between the p-type GaAs contact layer and the p-side ohmic contact electrode can be widened, so that the contact resistance can be lowered.

In the manufacturing method of the third embodiment of the present invention, meanwhile, the side face of the p-type AlGaInP or p-type AlInP layer smaller in refractive index than the cladding layer formed on the dovetail-shaped mesa side face is also of the dovetail-shaped mesa profile, and the width can be narrowed. Therefore, since the stripe width of current injection can be narrowed simultaneously by narrowing the stripe width of the index-guiding, a single lateral mode oscillation may be obtained at low threshold current.

According to the fabricating method of the sixth embodiment of the present invention, since epitaxial growth is required only once, the fabrication of the element is facilitated.

We claim:

1. In a semiconductor laser, an AlGaInP cladding layer of one conductive type, an active layer, and an AlGaInP cladding layer of other conductive type greater in thickness in stripes are formed on a GaAs substrate, an insulation layer lower in refractive index than the AlGaInP cladding layer of other conductive type is formed in a pair of stripes on the surface of the AlGaInP cladding layer of other conductive type at both sides of the stripes, and a current blocking layer of one conductive type is formed at the outer side thereof.

2. In a semiconductor laser, an AlGaInP cladding layer of one conductive type, an active layer, and an AlGaInP cladding layer of other conductive type with a dovetail-shaped mesa section greater in thickness in stripes formed in the $<01\bar{1}>$ direction are formed on a GaAs substrate having (100) as the principal plane, an insulation layer lower in refractive index than the AlGaInP cladding layer of other conductive type is formed on the dovetail-shaped mesa surface of the AlGaInP cladding layer of other conductive type, and a current blocking layer of one conductive type is formed at the outer side thereof.

3. In a semiconductor laser, an AlGaInP cladding layer of one conductive type, an active layer, and an AlGaInP cladding layer of other conductive type greater in thickness in stripes are formed on a GaAs substrate, an insulation layer lower in refractive index than the AlGaInP cladding layer of other conductive type is formed in a pair of stripes on the surface at both sides of the stripes of the AlGaInP cladding layer of other conductive type in a region in the vicinity of the output facet of laser light, and a current blocking layer of one conductive type is formed on the outer side thereof and on the surface of both sides of the stripes of the AlGaInP cladding layer of other conductive type in the region free from the insulation layer.

4. In a semiconductor laser according to any one of claims 1 to 3, a contact layer of other conductive type is formed on an insulating layer low in refractive index.

5. In a semiconductor laser, an AlGaInP cladding layer of one conductive type, an active layer, and an AlGaInP cladding layer of other conductive type greater in thickness in stripes are formed on a GaAs substrate, an AlGaInP or AlInP layer lower in refractive index than the AlGaInP cladding layer of other conductive type is formed in a pair of stripes on the surface of the AlGaInP cladding layer of other conductive type on both sides of the stripes, and a current blocking layer of one conductive type is formed on the outer side thereof.

6. In a semiconductor laser, an AlGaInP cladding layer of one conductive type, an active layer, and an AlGaInP cladding layer of other conductive layer with a dovetial-shaped mesa section greater in thickness in stripes formed in the $<01\bar{1}>$ direction are formed on a GaAs substrate having (100) as the principal plane, an AlGaInP or AlInP layer lower in refractive index than the AlGaInP cladding layer of other conductive type is formed on the dovetail-shaped mesa surface of the AlGaInP cladding layer of other conductive layer, and a current blocking layer of one conductive type is formed on the outer side thereof.

7. In a semiconductor laser, an AlGaInP cladding layer of one conductive type, an active layer, and an AlGaInP cladding layer of other conductive type greater in thickness in stripes are formed on a GaAs substrate, an AlGaInP or AlInP layer lower in refractive index than the AlGaInP cladding layer of other conductive type is formed in a pair of stripes on the surface at both sides of the stripes of the AlGaInP cladding layer of other conductive type in the region in the vicinity of the output facet of laser light, and a current blocking layer of one conductive type is formed on the outer side thereof and on the surface at both sides of the stripes of the AlGaInP cladding layer of other conductive type in the region free from the AlGaInP or AlInP layer lower in refractive index.

8. In a semiconductor laser according to any one of claims 5 to 7, the conductive type of the AlGaInP or AlInP layer low in refractive index is the other conductive type.

9. In a semiconductor laser according to any one of claims 5 to 7, a contact layer of other conductive layer is formed on the AlGaInP or AlInP layer of other conductive type low in refractive index.

10. In a semiconductor laser, an AlGaInP cladding layer of one conductive type, an active layer, an AlGaInP cladding layer of other conductive type, and a contact layer of other contact layer are formed in stripes on a GaAs substrate, and an AlGaInP cladding layer of other conductive type and an amorphous layer lower in refractive index than the AlGaInP cladding layer of one conductive type and the AlGaInP cladding layer of other conductive type are formed at both sides of the stripes.

11. In a semiconductor laser according to claim 10, a mixture of amorphous Si and amorphous $Si_3N_4$ or $SiO_2$ is used as the amorphous layer.

12. In a semiconductor laser according to claims 10 or 11, a diffusion layer of other conductive type is formed on the surface of the strip-shaped AlGaInP cladding layer of one conductive type, active layer, AlGaInP cladding layer of other conductive type and contact layer of other conductive type formed on the GaAs substrate.

* * * * *